United States Patent
Bolivar et al.

(10) Patent No.: US 7,876,605 B2
(45) Date of Patent: Jan. 25, 2011

(54) PHASE CHANGE MEMORY, PHASE CHANGE MEMORY ASSEMBLY, PHASE CHANGE MEMORY CELL, 2D PHASE CHANGE MEMORY CELL ARRAY, 3D PHASE CHANGE MEMORY CELL ARRAY AND ELECTRONIC COMPONENT

(75) Inventors: Peter Haring Bolivar, Wenden (DE); Bernard Bechevet, Claix (FR); Veronique Sousa, Grenoble (FR); Dae-Hwang Kim, Aachen (DE); Heinrich Kurz, Aachen (DE); Florian Merget, Aachen (DE)

(73) Assignees: Rheinisch-Westfaelische Technische Hochschle Aachen, Aachen (DE); Commisssariat a l'Energie Atomique, Paris (FR)

( * ) Notice: Subject to any disclaimer, the term of this patent is extended or adjusted under 35 U.S.C. 154(b) by 946 days.

(21) Appl. No.: 10/576,760

(22) PCT Filed: Oct. 19, 2004

(86) PCT No.: PCT/EP2004/011812
§ 371 (c)(1),
(2), (4) Date: Apr. 23, 2007

(87) PCT Pub. No.: WO2005/041196
PCT Pub. Date: May 6, 2005

(65) Prior Publication Data
US 2008/0101109 A1 May 1, 2008

(30) Foreign Application Priority Data
Oct. 23, 2003 (DE) ................................ 103 49 750

(51) Int. Cl.
*G11C 11/00* (2006.01)
*H01L 29/02* (2006.01)
(52) U.S. Cl. ...................... 365/163; 365/100; 365/148; 257/2; 257/296
(58) Field of Classification Search ................. 365/163
See application file for complete search history.

(56) References Cited

U.S. PATENT DOCUMENTS 3,448,302 A 6/1969 Shanefield (Continued)

FOREIGN PATENT DOCUMENTS

WO  WO 2004/057618 A2  7/2004

OTHER PUBLICATIONS

Geppert, Semiconductors, The New Indelible Memories, IEEE Spectrum, Mar. 2003, pp. 49-54.

(Continued)

*Primary Examiner*—Son L Mai
(74) *Attorney, Agent, or Firm*—Bachman & LaPointe, P.C.

(57) ABSTRACT

A phase change memory having a memory material layer consisting of a phase change material, and a first and second electrical contact which are located at a distance from one another and via which a switching zone of the memory material layer can be traversed by a current signal, wherein the current signal can be used to induce a reversible phase change between a crystalline phase and an amorphous phase and thus a change in resistance of the phase change material in the switching zone. The invention also relates to a phase change memory assembly, a phase change memory cell, a 2D phase change memory cell array, a 3D phase change memory cell array and an electronic component.

24 Claims, 7 Drawing Sheets

U.S. PATENT DOCUMENTS

| | | | |
|---|---|---|---|
| 4,420,766 A | 12/1983 | Kasten | |
| 4,599,705 A | 7/1986 | Holmberg et al. | |
| 4,795,657 A | 1/1989 | Formigoni et al. | |
| 5,049,971 A | 9/1991 | Krumm | |
| 5,933,365 A | 8/1999 | Klersy et al. | |
| 6,087,689 A | 7/2000 | Reinberg | |
| 6,287,887 B1 | 9/2001 | Gilgen | |
| 6,473,332 B1 | 10/2002 | Ignatiev et al. | |
| 6,525,953 B1 | 2/2003 | Johnson | |
| 6,815,704 B1 * | 11/2004 | Chen | 257/2 |
| 6,854,033 B2 | 2/2005 | Solomon et al. | |
| 7,214,632 B2 | 5/2007 | Chiang | |
| 7,227,171 B2 | 6/2007 | Bez et al. | |
| 7,358,521 B2 | 4/2008 | Wicker | |
| 7,791,059 B2 * | 9/2010 | Jedema et al. | 257/3 |
| 2008/0002457 A1 | 1/2008 | Toda et al. | |
| 2010/0188892 A1 * | 7/2010 | Baks | 365/163 |

OTHER PUBLICATIONS

Lai et al., OUM—A 180 nm Nonvolatile Memory Cell Element Technology for Stand Alone and Embedded Applications, IEDM 01-803, 2001, pp. 36.5.1-36-5.4, Santa Clara, CA.

Ovshinsky, Reversible Electrical Switching Phenomena in Disordered Structures, Physical Review Letters, Nov. 11, 1968, pp. 1450-1455, vol. 21, No. 20, Energy Conversion Devices, Inc., Troy Michigan.

Tyson et al., Nonvolatile, High Density, High Performance Phase-Change Memory, Mar. 18, 2000, pp. 385-390.

* cited by examiner

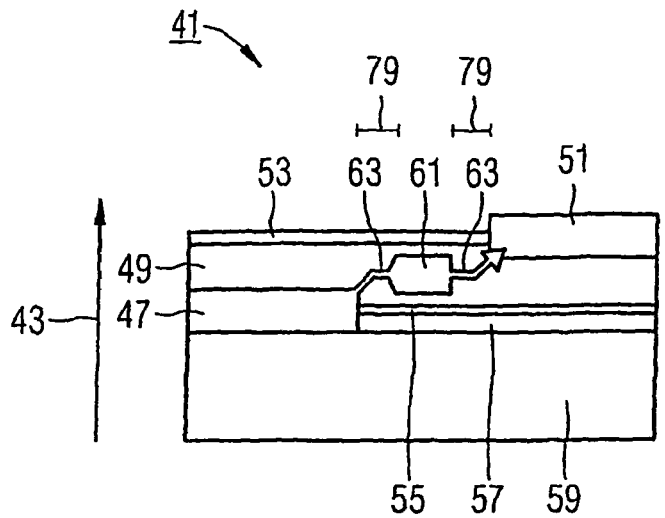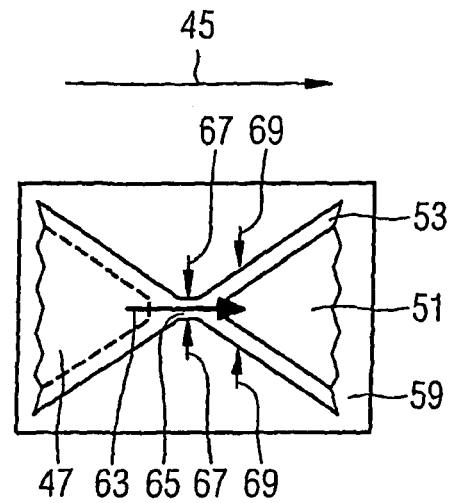
Fig. 3a  Fig. 3b
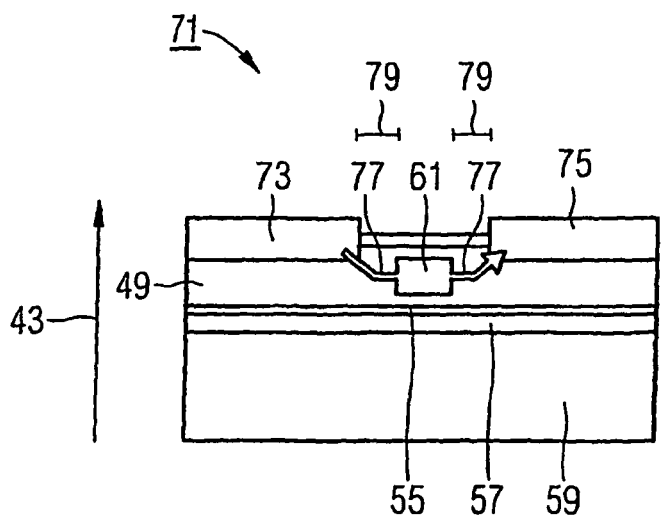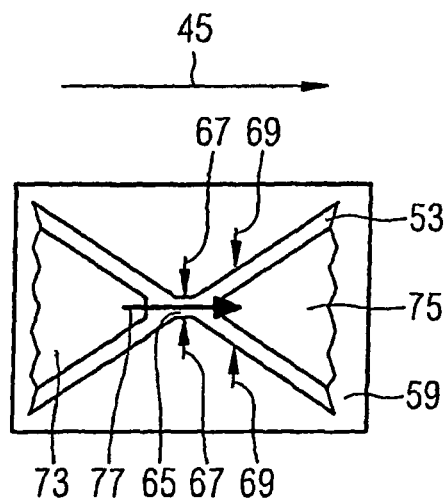
Fig. 4a  Fig. 4b

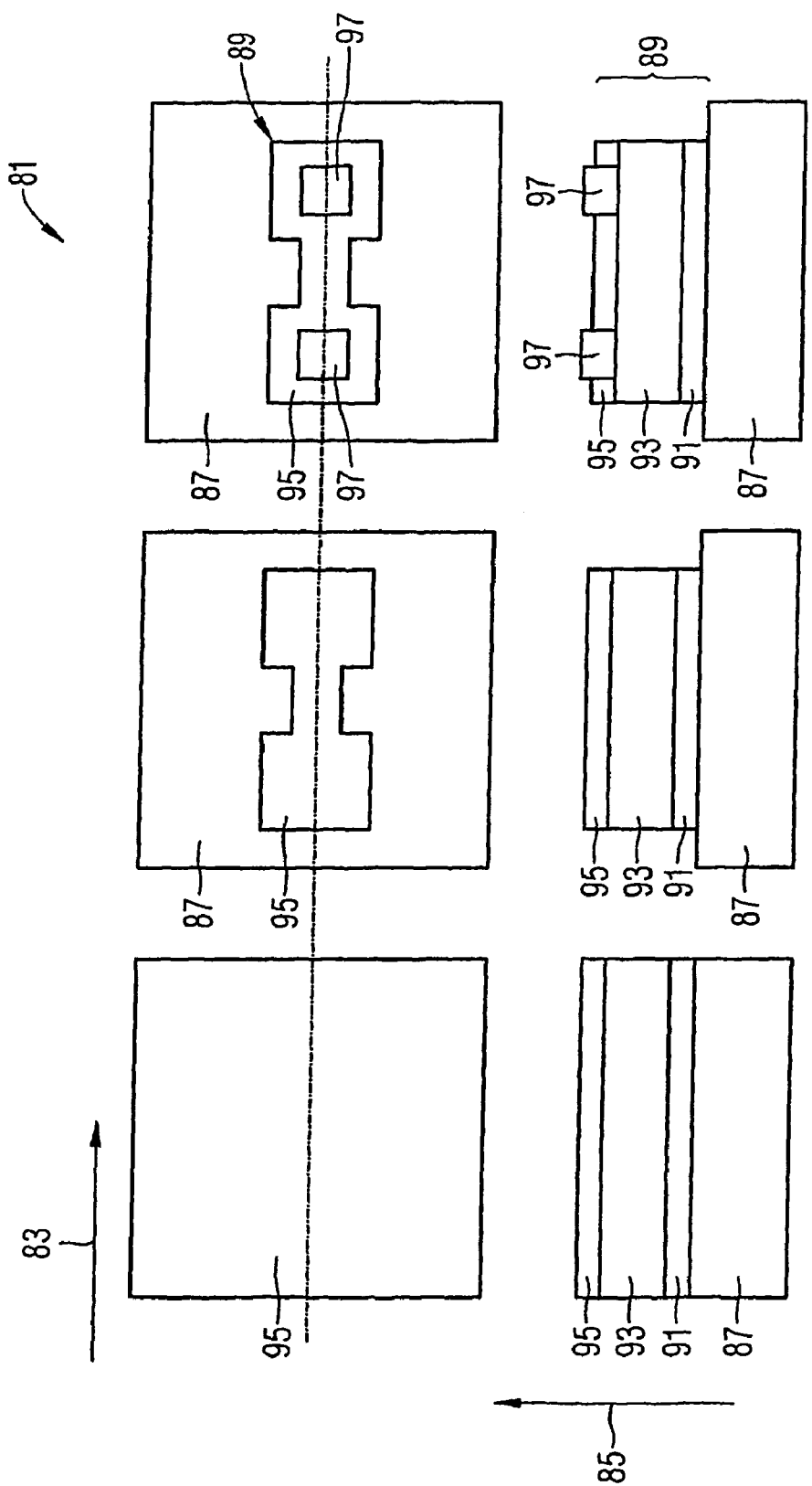

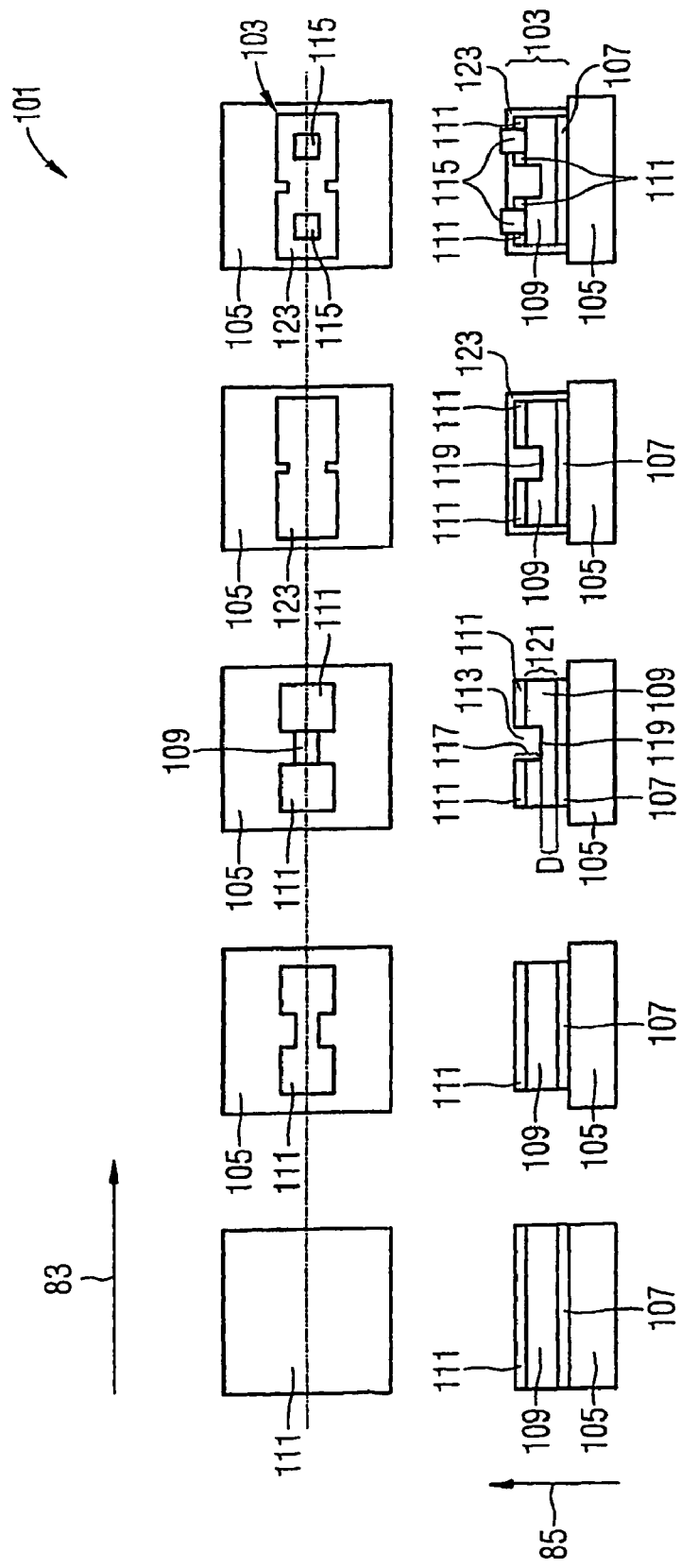

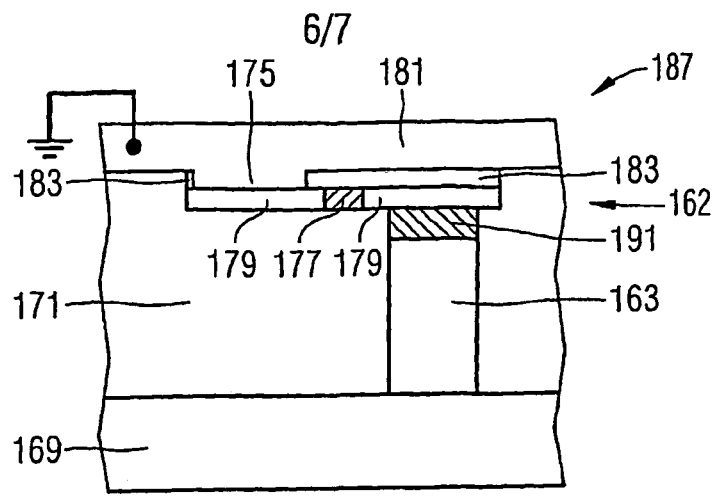
Fig. 9
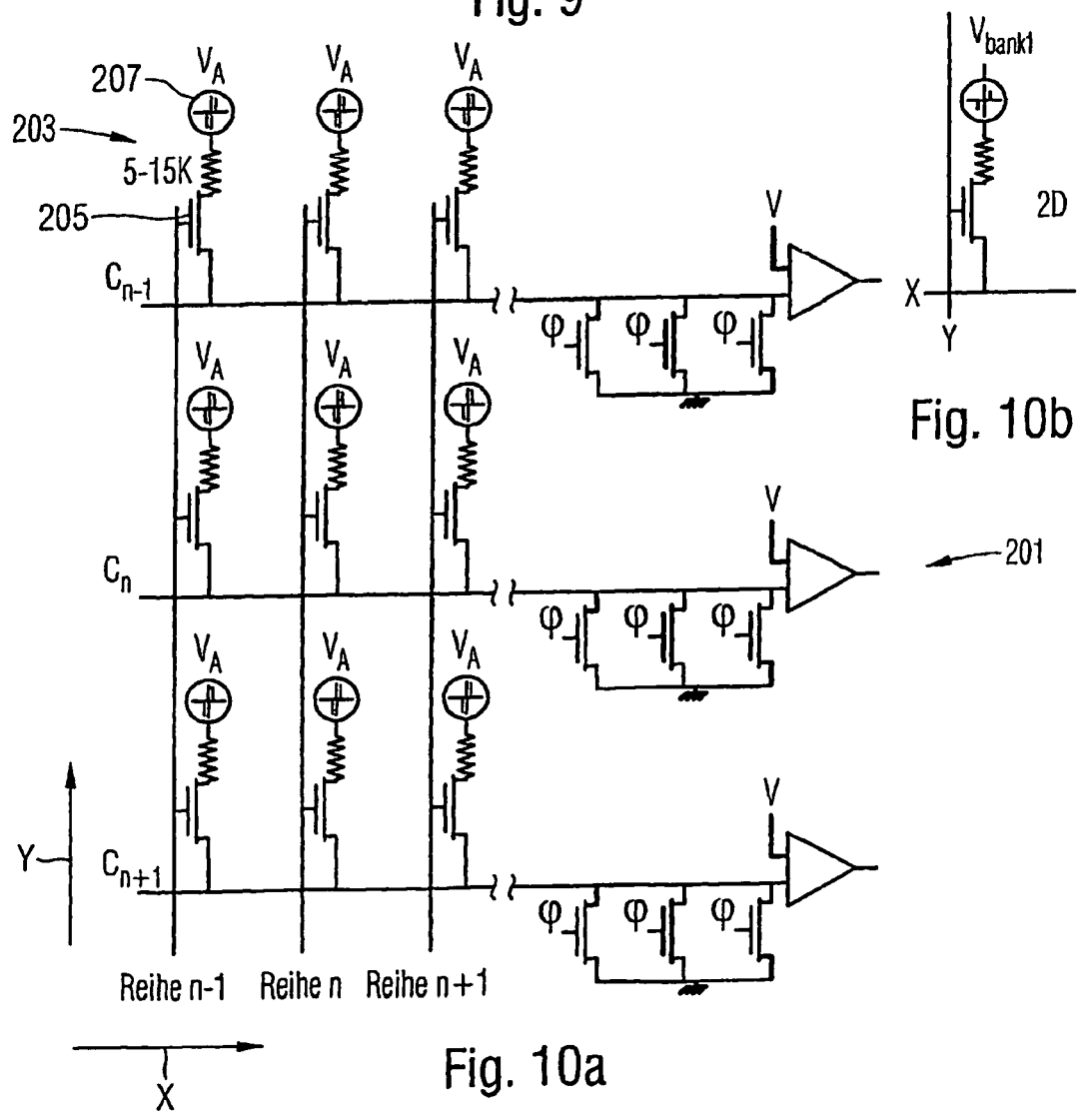
Fig. 10b
Fig. 10a

PHASE CHANGE MEMORY, PHASE CHANGE MEMORY ASSEMBLY, PHASE CHANGE MEMORY CELL, 2D PHASE CHANGE MEMORY CELL ARRAY, 3D PHASE CHANGE MEMORY CELL ARRAY AND ELECTRONIC COMPONENT

CROSS REFERENCE TO RELATED APPLICATIONS

This is the U.S. national phase of International Application No. PCT/EP04/11812, filed Oct. 19, 2004 which claims priority to German Application No. 103 49 750.1, filed Oct. 23, 2003.

BACKGROUND OF THE INVENTION

The invention relates to a phase change memory comprising a memory material layer consisting of a phase change material, and a first and second electrical contact which are located at a distance from one another and via which a switching zone of the memory material layer can be traversed by a current signal, wherein the current signal can be used to induce a reversible phase change between a crystalline phase and an amorphous phase and thus a change in resistance of the phase change material in the switching zone. The invention also relates to a phase change memory assembly, a phase change memory cell, a 2D phase change memory cell array, a 3D phase change memory cell array and an electronic component.

One of the essential basics of modern information technologies consists in non-volatile memories. In all data processing, data transmission and "consumer electronics" devices (digital cameras, video cameras, mobile telephones, computers, etc.), non-volatile memories are required in order to provide buffer storage of information, or in order to keep important information available for boot operations when the device is switched on. At present, the main electronic non-volatile memory is the so-called FLASH memory. Future non-volatile memories could be provided by magnetic memories (MRAM) or ferroelectric memories (FRAM) or in particular phase change memories (Phase-Change RAM/PC-RAM/PRAM/Ovonic Unified Memory-OUM).

The latter form the subject matter of this application. Phase change memories comprise a memory material layer consisting of a phase change material, and a first and second electrical contact which are located at a distance from one another. Via the electrical contacts, a switching zone of the memory material layer can be traversed by a current signal, which carries for example a pulsed switching current. The current signal can be used to thermally induce a reversible phase change between a crystalline phase and an amorphous phase and thus a change in resistance of the phase change material in the switching zone. In the case of a dynamic range for the change in resistance of up to three orders of magnitude, this is used for bit or multi-bit information storage in a phase change memory. The physical principle of a phase change memory will be explained in more detail in the detailed description relating to FIG. 1.

Phase change memories have been known in principle since the 1960s, and are described for example in the article "Reversible Electrical Switching Phenomena in Disordered Structures" by Ovshinsky in Physical Review Letters, Vol. 21, pages 1450-1453. The state of current technology can be found in the articles "OUM—A 180 nm Non-volatile Memory Cell Element Technology for Stand Alone and Embedded Applications" by Lai and Lowrey in IEEE 2001, pages 36.5.1 to 36.5.4 and "Nonvolatile, High Density, High Performance Phase-Change Memory" by Tyson, Wicker, Lowrey, Hudgens and Hunt in IEEE 2000, pages 385 to 390.

Current information technology means that a convergence can be expected between the fields of cost-effective bulk memories (e.g. hard disks and optical data memories) and fast electric memories (e.g. FLASH), resulting in so-called "Unified Memories" (PC-RAM) which combine cost-effective production with rapid random addressing in order to operate in both market sectors with a single technology. The ease of implementation and the potential of phase change memories as non-volatile memories in this scenario depends primarily on the degree to which a plurality of phase change memories can be highly integrated. To this end, it must be possible for a phase change memory to be switched by means of the smallest possible switching currents of a current signal, since a phase change memory could otherwise not be operated by future highly integrated CMOS control transistors.

The present concept of a phase change memory is described in detail in U.S. Pat. No. 5,933,365. This concept is based on a vertical current flow between two electrical contacts of the phase change memory which are arranged one above the other. That is to say, the current of a current signal for switching a phase change memory of the type mentioned above is conducted perpendicularly to the lateral extension of the phase change memory, that is to say perpendicularly to the deposition/lithography plane of the phase change memory, between two electrical layer contacts which are arranged one above the other in the vertical extension. According to the conventional view, this "vertical" structure of a phase change memory is the preferred structure in order to be able to integrate as many cells as possible in a phase change memory array by way of row/column (X/Y) addressing. One example of a three-dimensional (3D) phase change memory array is described in U.S. Pat. No. 6,525,953 B1.

One problem is that the phase change between a crystalline phase and an amorphous phase in the phase change material is induced thermally via a current pulse of the current signal, e.g. using a temperature range between room temperature and 600° C. The current signal is fed into the phase change memory via the electrical contacts, which are usually made of metal, such that a switching zone of a memory material layer is traversed by the current signal. Since electrical conductors are usually also good heat conductors, this means in the conventional concepts of a phase change memory that a high energy loss occurs between the thermally influenced switching zone and the electrical contact, which in turn makes it necessary to increase the switching currents of the current signal.

However, small control transistors, which are necessary for any memory element that can be highly integrated, usually do not supply enough current to switch a conventional phase change memory having a vertical structure. The solution favoured in U.S. Pat. No. 5,933,365 therefore consists in the use of a so-called "heater", that is to say a "heater" layer is applied in each case between an electrical contact and the memory material layer within the context of the vertical structure, said heater layer being made of a material which is less of a conductor of current and heat than the electrical contact itself. The "heater" therefore has a thermally insulating effect between the memory material layer and the electrical contact. In this way, the switching zone of the phase change memory can be heated more efficiently, and as a result can be switched by lower switching currents. This means that a phase change between a crystalline phase and an amorphous phase and thus a change in resistance of the phase change material in the switching zone can be induced by lower switching currents of a current signal.

However, the effect of the "heater" layer provided in U.S. Pat. No. 5,933,365 within the context of the vertical structure of the phase change memory is limited and does not reduce the switching current requirement for a current signal to an extent such that a sufficiently high level of integration can be achieved. Moreover, the structure of a phase change memory becomes increasingly complicated on account of the "heater" layers.

SUMMARY OF THE INVENTION

The object of the present invention is to provide a phase change memory and components built thereon, wherein the switching current of a current signal and the heat loss via the electrical contacts of the phase change memory are kept as low as possible and at the same time the structural design of a phase change memory is kept as simple as possible.

This object is achieved by the invention by means of a phase change memory of the type mentioned in the introduction, in which according to the invention the switching zone is located along a lateral extension of the phase change memory between the first and second electrical contacts, wherein current conduction of the current signal through the switching zone takes place along the lateral extension.

The structural design of the present phase change memory is therefore such that, in the switching mode, the switching current of the current signal flows through the switching zone laterally, that is to say parallel to the lithography/deposition plane. Current conduction of the current signal through the switching zone therefore takes place along the lateral extension.

The switching zone, that is to say the zone within the memory material layer within which the current signal is used to induce a phase change between a crystalline phase and an amorphous phase and thus a change in electrical resistance of the phase change material, is therefore located in a region between the first and second electrical contacts in which current conduction of the current signal is oriented along the lateral extension, so that the switching zone is therefore arranged along the lateral extension.

The lateral current conduction of the present phase change memory thus forms the basis of a completely novel concept of a "lateral" structure of a phase change memory, which differs fundamentally from the conventional approaches of a "vertical" structure as disclosed for example in U.S. Pat. No. 5,933,365. This is because preference would usually be given to current conduction of the current signal along a vertical extension of a conventional phase change memory, that is to say perpendicularly to the lateral extension, between two electrical contacts arranged one above the other in the vertical direction. Such a "vertical" structure would also usually in principle be preferred as an add-on to the CMOS standard, since it allows a space-saving and compact structure so that usually a high integration density could be achieved with a vertical structure.

By contrast, the present invention has found that, in order to achieve a high integration density for a phase change memory, preference should be given to a "lateral" structure or a "lateral" concept, that is to say current conduction of the current signal running in the switching zone along the lateral extension, and a corresponding structure of the phase change memory. This is because, in a phase change memory, in addition to a compact structure, the current consumption of the phase change memory is also a parameter which significantly limits the integration density. The current consumption is determined by the switching current of the current signal. The lower the current consumption of a phase change memory, the higher the latter can be integrated, since the switching currents switched by the transistors can be smaller and thus so too can the transistors themselves.

It should be noted that a surface area which is traversed by current in a phase change memory having a vertical structure lies in the lithography/deposition plane. Only the lithography size F (minimum feature size) has an effect on the surface area which is traversed by current in a phase change memory having a vertical structure, and thus on the switching current of the current signal, so that at least a traversed surface area of $F^2$ and an accordingly high current must be assumed.

With the present lateral structure of the phase change memory, this is fundamentally different. In the present case, the surface area which is traversed by current is formed perpendicularly to the lateral extension. When the current of the current signal is conducted through the switching zone along the lateral extension, the minimum feature size F merely has a linear effect on the traversed surface area. The surface area which is traversed by current in a phase change memory having the lateral structure is additionally determined only by the thickness D of the memory material layer in the switching zone. The surface area which is traversed by current, and thus the switching current of the signal, is thus defined only in a linear manner by the minimum feature size F on the one hand and the layer thickness D of the memory material layer in the switching zone on the other hand, that is to say by F×D. The required switching current of the current signal is accordingly low.

Meanwhile, layer thicknesses D can be technologically controlled and processed considerably below 3 nm and moreover extremely accurately, to atomic precision, that is to say approximately in the region of 0.5 nm. Accordingly, the minimum feature size F must be reduced in a much more complicated manner. Present high-technology memories use minimum feature sizes F in the region of 130 nm, and minimum feature sizes F in the region of 45 nm will be desired in future. This is opposed by a layer thickness size D in the region of 10-20 nm, advantageously below 10 nm, in particular below 5 nm, which can readily be achieved in technological terms. In the present phase change memory having a lateral structure, the surface area of the switching zone which is traversed by current and thus the switching zone itself can thus be reduced considerably compared to a phase change memory having a vertical structure. The surface area which is traversed by current in a lateral structure of a phase change memory, that is to say the traversing surface area, formed perpendicularly to the lateral extension, for the current conduction in the switching zone is considerably reduced compared to a phase change memory having a vertical structure. The present phase change memory according to the lateral structure will therefore be more energy-saving, highly integratable and scalable than conventional phase change memories.

The phase change material is advantageously a chalcogenide material, that is to say a chalcogenide alloy, i.e. an alloy based on the materials of the chalcogenides (main group VI of the periodic table), and can in principle be processed by means of standard processes such as ion milling, reactive ion etching or a plasma etching process. Moreover, it has presently been acknowledged that a chalcogenide material of the memory material layer of the present phase change memory can be deposited in a particularly advantageous manner within the context of a sputtering process.

Whereas in the case of conventional phase change memories having a vertical structure the electrical current transport and the dissipation of heat away from the switching zone have the same (vertical) direction, in the case of the present phase change memory according to the lateral concept the flow of heat runs mainly in the vertical direction while the electrical switching current of the current signal runs in the lateral direction. Optimization of the current conduction of the current signal within the context of electrical current transport has a direct effect on the current consumption of the phase change memory. Optimization of the thermal conversion of the switching current of the current signal in the switching zone has an effect on the current consumption and the ability to be rewritten and/or the speed of a phase change memory. These two essential optimization parameters—electrical current consumption and dissipation of heat—are therefore optimized independently and autonomously of one another in the present phase change memory according to the lateral concept. A further reduction in the switching currents and an improvement in the general performance of the present phase change memory can thus be achieved.

According to the invention, it is also provided that the switching zone is located at a narrowing between the first and second electrical contacts in the memory material layer, wherein a size of the narrowing is smaller than a size of the memory material layer at the first or second electrical contact. Here, the location of the switching zone between the first and second electrical contacts is essentially defined by the location of the narrowing. In particular, the switching zone is formed by the narrowing between the first and second contacts in the memory material layer. The size of the narrowing may be the size of a traversing surface area, formed perpendicularly to the lateral extension, for the current conduction in the switching zone. The smaller the narrowing of the memory material layer in the switching zone, the smaller the switching current of the switching signal that is required for the thermally induced phase change and thus the change in resistance of the phase change material in the switching zone. The significant advantage of the phase change memory proposed here is the fact that, on account of the lateral structure, the narrowing is also determined by the thickness D of the memory material layer, which in technological terms can be processed without any problems far below 20 nm, advantageously below 10 nm or 5 nm. In the lateral extension of the phase change memory, the narrowing is also determined by the minimum feature size F. At present, F can easily lie in the region of 130 nm. In future, sizes in the region of 45 nm or below will be desired for F. "Moore's Law" applies here, that is to say halving of F also leads to halving of D.

Advantageous further developments of the invention can be found in the dependent claims and provide in detail advantageous possibilities for the further development of the proposed phase change memory within the context of the lateral structure and concept with regard to current minimization while at the same time having a simple structural design and also concerning further advantages.

It has proven to be particularly advantageous that a traversing surface area, formed perpendicularly to the lateral extension, for the current conduction in the switching zone is narrowed in relation to a traversing surface area for the current conduction at the first or second electrical contact, wherein the ratio of the traversing surface areas, that is to say the surface contrast, advantageously lies between 1:2 and 1:100. Such a strong focussing of the current in a correspondingly small switching zone defined by the narrowing can advantageously be readily achieved according to the lateral structure and concept of the phase change memory proposed here. This leads to a considerable current reduction and thus to a possible integration density which would not be possible with a vertical structure of a phase change memory as customary to date.

The narrowing may be formed in the lateral and/or vertical extension of the phase change memory. In particular, it proves to be advantageous if a size of the narrowing in the lateral extension is smaller than a size of the memory material layer in the lateral extension at the first or second electrical contact. A double-cone-shaped or H-shaped structure has proven particularly suitable here.

Advantageously, it is also possible for a size of the narrowing in the vertical extension to be smaller than a size of the memory material layer in the vertical extension at the first or second electrical contact. This may be effect by reducing the layer thickness of the memory material layer in any way in a region between the first and second electrical contacts, and this region then essentially forms the switching zone.

According to the abovementioned further developments of the invention, the switching zone is therefore advantageously formed by a restriction or narrowing of the lateral and/or vertical extension of the memory material layer, that is to say is formed and located in the phase change material itself. The highest current density thus occurs in the switching zone and thereby thermally induces, within a volume of the switching zone that is defined in terms of orders of magnitude by the minimum feature size F and the layer thickness D, the phase change between the crystalline phase and the amorphous phase and thus the change in resistance of the phase change material within the memory material layer.

This leads to a further particularly preferred further development of the invention, in which the first and/or second electrical contacts directly adjoin the memory material layer and the switching zone is formed in the memory material layer at a distance from the first and/or second contact.

Since the narrowing which defines the switching zone is located in the phase change material of the memory material layer itself and at the same time is located at a distance from the electrical contacts applied directly to the memory material layer, the phase change material surrounding the switching zone in the memory material layer therefore has a heat-insulating effect between the switching zone and the electrical contacts. On account of the lateral concept and structure of the present phase change memory, the high temperatures and the rapid temperature changes of the switching zone can be kept far away from the contact materials of the electrical contacts.

The thermal distance between the switching zone and the electrical contacts is therefore on the one hand selected to be large enough that the switching zone and the electrical contacts are practically decoupled in thermal terms. This has the advantage that the transport of energy away from the switching zone to the electrical contact is practically ruled out, and this leads to efficient use of the switching current of the current signal with regard to the thermal phase transformation in the switching zone since the latter can heat up more efficiently to the phase change temperature. Furthermore, the high temperatures of the switching zone are kept far away from the contact materials of the electrical contacts, so that atomic interdiffusion of the contact materials is prevented. As a result, the electrical contacts have a particularly long service life, even though they are applied directly to the memory material layer.

On the other hand, the thermal distance between the switching zone and the electrical contacts is selected to be small enough that, in the normal state, the best possible current conductivity between the electrical contacts is achieved.

It has been found that the thermal distance between the switching zone and one of the electrical contacts lies particularly advantageously between 20 and 50 nm. This ensures a sufficiently great temperature reduction between the switching zone and the electrical contacts and at the same time allows sufficient current conductivity.

By virtue of the particularly preferred further development of the invention described here, it is therefore possible for customary contact materials of the semiconductor industry to be used, wherein the proposed phase change memory permits improved long-term stability and particularly simple process control during production. Complicated contact layer systems which have been customary to date for screening or insulating the electrical contacts from the switching zone using so-called "heater" layers or diffusion barriers (usually composed of TiWNi and graphite) are thus avoided.

In the abovementioned further developments of the invention, it has been found that the switching zone can be traversed by the current signal along the lateral extension particularly when the switching zone is located between the electrical contacts in such a way that at least a thermal distance of the switching zone from each of the electrical contacts can be kept within the range from 20 to 50 nm. A switching zone is located between electrical contacts along a lateral extension particularly when the current conduction in the switching zone, or optionally beyond, at least 20 nm, advantageously 40 nm, takes place essentially parallel to the lithography/deposition plane.

Accordingly, a switching zone need not necessarily be located on a direct connecting line between a first and second electrical contact, but rather it is sufficient if the switching zone is located in a region which lies along the lateral extension between a first and second electrical contact. In this case, the first and second electrical contacts are advantageously located in such a way that current conduction of the current signal through the switching zone can take place in a particularly simple manner along the lateral extension. According to one preferred further development of the invention, the distance between the first and second electrical contact is oriented essentially along the lateral extension. In this case, a connecting line between the electrical contacts should run essentially parallel to the lithography/deposition plane and if possible should deviate from this plane by no more than 45°. Specifically, the arrangement of the electrical contacts can be selected in a manner depending on the design of the phase change memory.

It proves to be particularly advantageous for many applications if the distance between the first and second electrical contact is oriented along the lateral extension, wherein the first electrical contact is located below the memory material layer and the second electrical contact is located above the memory material layer. In order to prevent current conduction of the current signal through the switching zone along the vertical extension, the first electrical contact and the second electrical contact are in any case not arranged along a vertical extension of the phase change memory. The arrangement of an electrical contact below the memory material layer has the advantage that the contacting of the phase change memory can take place on the substrate side.

For other applications, the distance between the first and second electrical contact is advantageously oriented along the lateral extension, wherein the first and the second electrical contacts are located above the memory material layer.

In particular, an arrangement of the switching zone in a region between the first and second electrical contact and below the first and/or second electrical contact along the lateral extension proves to be advantageous.

Yet another particularly preferred further development of the invention consists in that a core forming zone directly adjoins the memory material layer. This is because it has been found that, during the switching operation in the switching zone, the crystallization of the amorphized material is the slower process in comparison with the amorphization. This may last up to 200 ns. For the crystallization, firstly cores form and then these grow until the switching zone is largely crystallized. A core forming zone which directly adjoins the memory material layer, and preferably directly adjoins the switching zone, in any case shortens the core formation and makes it possible in the present further development of the invention to shorten the switching time in any case to 20 ns.

Preferably, the core forming zone is designed in the form of a layer. The core forming material may be a nitride-based material. A core forming zone is preferably processed by briefly exposing the processing surface to an $N_2$ process atmosphere during the deposition of the memory material layer, i.e. the chalcogenide layer for example. A core forming zone which extends along the lateral extension can be implemented with particular advantage within the context of the lateral concept of a phase change memory proposed here. By contrast, this would not be possible in the context of a vertical structure, since a nitride layer has electrically insulating properties and in any case inhibits vertical current conduction.

Advantageously, in the proposed phase change memory, the first and second electrical contacts and the memory material layer form part of a MESA structure which is applied to a substrate, wherein the memory material layer is insulated from a heat sink by a thermal barrier. A core forming layer, in particular based on nitride, may advantageously be arranged between the memory material layer and the thermal barrier. The thermal barrier is advantageously a layer based on ZnS:$SiO_2$. The phase change material is advantageously a chalcogenide material, e.g. a GeSbTe-based material. The heat sink may be formed by the substrate material, in particular a Si substrate. In this case, the heat sink would be located below the phase change memory. A metal layer can also be used as heat sink, said metal layer being arranged above or below the phase change memory.

In one variant, the invention also relates to a phase change memory assembly comprising one or more phase change memories according to any of the preceding further developments, wherein in each case one of the electrical contacts of each phase change memory lies at the same electrical potential as a respective one of the electrical contacts of the other phase change memories. That is to say that in each case one contact of each phase change memory may for example be at ground. In this way, a wide range of different arrangements can be implemented, as explained by way of example in the detailed description.

For another refinement of a phase change memory or a phase change memory assembly according to one of the abovementioned further developments, a phase change memory may also have one or more further electrical contacts in addition to the first and second electrical contacts, depending on requirements.

The invention also relates to a phase change memory cell comprising a phase change memory according to any of the aforementioned further developments of the invention and/or a phase change memory assembly, wherein a selection unit with a non-linear current/voltage characteristic is provided. On account of its non-linear current/voltage characteristic, the selection unit is provided for actuating the phase change memory, e.g. within the context of an array. The selection unit may in particular be a diode or a transistor. For an X/Y addressing for example in an array of such phase change memory cells, all cells of a row are addressed via one addressing contact and all the cells of a column are addressed via a further addressing contact. Only the cell which is addressed by a certain row and a certain column at the same time is actually addressed, since, due to the non-linear current/voltage characteristic, an addressing signal (e.g. a voltage) lies above a threshold signal only for the addressed cell.

In principle, a selection unit can be arranged external to the phase change memory. However, it proves to be particularly advantageous if a selection unit is integrated in the phase change memory itself and/or in the phase change memory assembly itself. In particular, a selection unit can be located between the memory material layer and the first electrical contact and/or between the memory material layer and the second electrical contact. This is explained in detail in FIGS. 8 and 9 of the detailed description. Such a further development of the invention makes it superfluous to process a selection unit external to the phase change memory. Rather, the latter can advantageously be integrated in the structure of the phase change memory. For this type of further development of the invention, a phase change memory in which the first electrical contact is located below the memory material layer proves to be particularly suitable. The arrangement of a diode as selection unit between the memory material layer and the first contact located below the memory material layer is particularly suitable for a two-dimensional (2D) phase change memory cell array. The arrangement of a diode as selection unit between the memory material layer and the second contact located above the memory material layer is particularly suitable for a three-dimensional (3D) phase change memory cell array.

The invention also relates to a two-dimensional (2D) phase change memory cell array in which a number of two-dimensionally connected and individually addressable phase change memory cells according to any of the preceding further developments are arranged.

Within the context of a three-dimensional (3D) phase change memory cell array, a number of memory layers in the form of 2D phase change memory cell arrays according to any of the preceding further developments of the invention are arranged one above the other.

It proves to be particularly advantageous if respective phase change memories and/or cells which are arranged directly above one another are contacted by way of a common via. Contacting by way of a common via can be implemented in a particularly advantageous manner within the context of the present lateral concept and structure of a phase change memory, whereas each column and row of each phase change memory cell array in all memory layers of the 3D array has to be contacted individually within the context of a vertical structure of a conventional phase change memory, as in U.S. Pat. No. 6,525,953 B1. By contrast, in the present (3D) phase change memory cell array comprising phase change memories according to the lateral concept and structure, each column and row only has to be contacted once for all memory layers together.

According to one further development of the 3D phase change memory cell array according to the lateral concept and structure, in order to address a selected phase change memory of a 2D phase change memory cell array, respective phase change memory cells which are arranged directly above one another can be switched to a first potential by way of the common via, and in the process all the other phase change memory cells of any other 2D phase change memory cell array can be switched to a second potential. This type of switching proves to be particularly advantageous for the three-dimensional addressing of the present 3D phase change memory cell array. For the purposes of the row/column (X/Y) addressing for the planes, all the phase change memory cells along a Z-direction can be placed at a fixed potential, as first potential, by way of the common via and in this way an X/Y selection is made. The Z-addressing takes place here by placing all the phase change memory cells in the selected 2D phase change memory cell array at a free potential, as the second potential, for example at ground. The rest of the 2D phase change memory cell arrays are in a "floating state/high impedance state".

The invention also relates to an electronic component with an integrated memory function and/or logic function, comprising a phase change memory and/or a phase change memory assembly and/or a phase change memory cell and/or a phase change memory cell array according to any of the abovementioned further developments of the invention. This may in particular be an Application-Specific Integrated Circuit (ASIC) with an integrated memory function and/or logic function. Such electronic components are used in particular in data processing, data transmission and "consumer electronics" devices such as mobile telephones, computers and video cameras and/or digital cameras.

Examples of embodiments of the invention will now be described below with reference to the drawing. The latter is intended to show the examples of embodiments, not necessarily to scale; rather, the drawing is given in a schematic and/or slightly distorted form where this is deemed useful for explanation purposes. In respect of supplementary details concerning the teaching which can be taken directly from the drawing, reference is made to the relevant prior art. It should be noted here that many modifications and changes in respect of the form and details of an embodiment can be made without departing from the general concept of the invention. The features of the invention which are disclosed in the description, the drawing and the claims may be essential to the invention both individually and in any combination. The general concept of the invention is not limited to the exact form or details of the preferred embodiment described and shown below, nor is it limited to a subject matter which may be restricted in comparison with the subject matter claimed in the claims.

BRIEF DESCRIPTION OF THE DRAWINGS

FIG. 3 consisting of FIGS. 3a and 3b is a preferred first embodiment of the proposed phase change memory, in which the first electrical contact is located below the memory material layer and the second electrical contact is located above the memory material layer.

FIG. 4 consisting of FIGS. 4a and 4b is a second preferred embodiment of the proposed phase change memory, in which the first and second electrical contacts are located above the memory material layer.

FIG. 5 consisting of FIGS. 5a, 5b and 5c is a first schematically shown processing sequence for a further preferred embodiment of the proposed phase change memory.

FIG. 6 consisting of FIGS. 6a, 6b, 6c, 6d and 6e is a second schematically shown processing sequence for yet another preferred embodiment of the proposed phase change memory.

FIG. 9 is a modified, schematically shown particularly preferred embodiment of a phase change memory cell, in which a diode is integrated as selection unit in the phase change memory.

FIG. 10 consisting of FIGS. 10a and 10b is an equivalent circuit diagram for a particularly preferred embodiment of a 2D phase change memory cell array (Reihe=Row).

FIG. 11 consisting of FIGS. 11a and 11b is a schematic diagram of a particularly preferred embodiment of a 3D phase change memory cell array with equivalent circuit diagram.

DETAILED DESCRIPTION

Embodiments of the invention will be described with reference to the accompanying drawing figures wherein like numbers represent like elements throughout.

Figure 1:
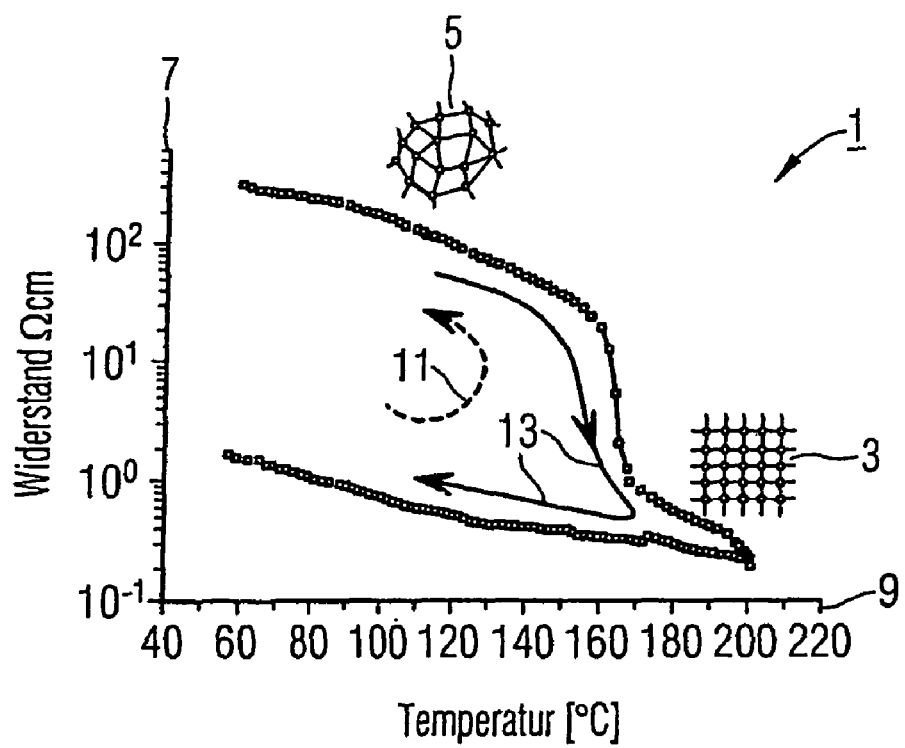
FIG. 1 is a resistance/temperature graph illustrating the phase change between a crystalline phase and an amorphous phase and thus a change in resistance of the phase change material in the switching zone (Widerstand=Resistance, Temperatur=Temperature).

FIG. 1 shows a resistance/temperature graph 1 recorded at a heating rate of 23° C. per minute, which illustrates in principle the phase change between a crystalline phase 3 and an amorphous phase 5 and thus a change in resistance 7 of a phase change material in a switching zone of a memory material layer of a phase change memory. The change in resistance 7 is thermally induced in a phase change memory by means of a current signal via a change in temperature 9. A preferred chalcogenide phase change material may be both in a stable crystalline phase 3 and in a meta-stable amorphous phase 5 at room temperature. The reversible phase transformation within the context of an amorphization or crystallization between the two phases 5, 3 is accompanied by a significant change in electrical resistance 7 and thus is used to store a digital information item. A phase change material advantageously exhibits an extremely large dynamic range of a change in resistance 7, which may comprise more than three orders of magnitude. This has the advantage that, for example, multi-bit storage in a phase change memory cell is also possible. On account of the material, a phase change memory cell can also be read at low currents without destroying the stored information items (non-destructive readout). In addition, in the present lateral concept and structure of a phase change memory, it is also possible, depending on the current supply, to implement a phase transition in just part of the switching zone or the entire switching zone, so that a multiple logic can thus be implemented depending on the current supply. This may take place in such a way that, for example, a first, relatively small part of the switching zone undergoes phase transformation at a first, low current and a second, larger part of the switching zone undergoes phase transformation at a second, higher current.

Besides the lower production costs of the lateral concept presented here compared to the vertical concept, the integration property in particular proves to be much better than in other concepts, that is to say in future higher integration densities with increasingly low current consumption will be able to be implemented due to the lower switching current requirement of the phase change memory in the lateral concept presented here.

The graph of FIG. 1 shows a sequence of quasi-static states, so that the dynamic phase transformation processes of a crystallization 13 and an amorphization 11 can anyhow be shown in principle. In each case, the processes are illustrated here by corresponding arrow directions. The crystallization process 13 is the slower process. The amorphization process 11 on the other hand is the faster process, which cannot actually be described by a sequence of quasi-static states. In the graph, the amorphization 11 is illustrated by a dashed line.

FIG. 1 can illustrate the principle for an operating scenario of a phase change memory. In the operating scenario, the temperature fluctuations 9 are around 300° C. higher than those shown in the graph.

Specifically, the phase change between the crystalline phase 3 and the amorphous phase 5 in the phase change material is achieved by coordinated heating and cooling within the context of an (advantageously pulsed) switching current supply from a current signal. For the amorphization 11, the phase change material is firstly melted. By rapid cooling of the melt, the latter solidifies in the amorphous state 5. One condition for the amorphization 11 is that the cooling rate from the melting temperature to a glass temperature, which is usually approximately ⅔ of the melting temperature, is greater than the core forming and growth rate in the temperature range. The cooling rate from the glass temperature to room temperature does not play any role in the amorphization 11. The typical value of a critical cooling rate lies between $10^9$ to $10^{10}$° K/sec. Although the amorphous state 5 is meta-stable, the stability period is more than 10 years at room temperature, which represents a stability period that is uncritical even for long-term storage.

The crystallization 13 of the amorphized material 5 to the crystalline state 3 takes place by heating above the glass temperature, with the maximum temperature remaining below the melting temperature. In this temperature range, the core forming and growth rate is at a maximum. In the present concept, within the context of an embodiment as explained with reference to FIGS. 3 and 4, a core forming zone is advantageously arranged such that it directly adjoins the memory material layer, since in this way the core formation can be shortened and a switching time during crystallization can be shortened to 20 ns, whereas otherwise switching times in the region of 200 ns can be achieved.

The amorphization 11 and the crystallization 13 thus take place in each case at a suitably high temperature and with different dynamics. In the embodiment explained here, the phase transformations 11, 13 in a phase change memory are used by three pulses for a read operation (Read), a crystallization 13 (Set) and an amorphization 11 (Reset).

For the Set operation, a relatively "long" switching current pulse is used, with typical pulse lengths in the region of 50 ns. As a result of ohmic losses, the temperature 9 in the switching zone rises above the glass temperature. The switching zone crystallizes for as long as the pulse is present.

For the Reset operation, the crystalline switching zone is heated above the melting temperature by means of a relatively "short" pulse, wherein typical pulse lengths are below 10 ns. Due to rapid cooling once the pulse is switched off, the melt solidifies to the amorphous state 5.

For the Read operation of the stored information items, a response, e.g. a voltage state, of the phase change memory/ phase change memory cell to a weak current pulse is measured. The pulse length here depends only on the integration time of the current measurement stage, and is in the region of approximately 10 ns.

For further basic explanations concerning the physical mode of action of a phase change memory, reference is made to the abovementioned article "Nonvolatile, High Density, High Performance Phase-Change Memory" by Tyson, Wicker, Lowrey, Hudgens and Hunt in IEEE 2000, pages 385 to 390.

Figure 2:
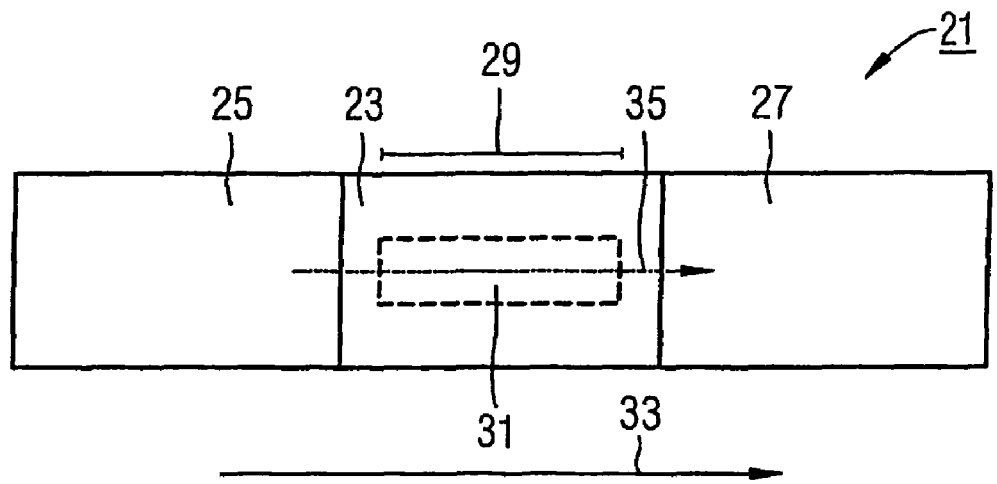
FIG. 2 is a schematic structure of a phase change memory, in which the switching zone is located along a lateral extension of the phase change memory between the first and second electrical contacts, wherein current conduction of the current signal through the switching zone takes place along the lateral extension.

FIG. 2 shows the schematic structure of a phase change memory 21 comprising a memory material layer 23 consisting of a phase change material, and a first electrical contact 25 and a second electrical contact 27 which are located at a distance 29 from one another. Via the contacts 25, 27, a switching zone 31 of the memory material layer 23 can be traversed by a current signal. The current signal can be used to thermally induce, by means of a change in temperature 9, a phase change 11, 13 (explained by way of example with reference to FIG. 1) between a crystalline phase 3 and an amorphous phase 5 and thus a change in resistance 7 of the phase change material in the switching zone 31. According to the present lateral concept and structure of the phase change memory, the switching zone 31 is located along a lateral extension 33 of the phase change memory 21 between the first electrical contact 25 and the second electrical contact 27, wherein current conduction 35 of the current signal through the switching zone 31 takes place along the lateral extension 33.

FIG. 3 shows a first preferred embodiment of a proposed phase change memory 41. View (a) shows in section the structure of the embodiment along a vertical extension 43 of the phase change memory 41. View (b) shows the embodiment along a lateral extension 45 of the phase change memory 41. In the present case, the first electrical contact 47 is located below the memory material layer 49 and the second electrical contact 51 is located above the memory material layer 49. In this embodiment of the phase change memory 41, the electrical contacts 47, 51 are metallic. The active zone of the phase change memory 41 is passivated 53 with silicon oxide ($SiO_2$). The memory material layer 49 in this embodiment consists of a GeSbTe-based phase change material. A nitride layer 55 located therebelow assists the crystal core formation in order to allow faster and more reproducible switching of the switching zone. A $ZnS:SiO_2$ layer 57 which in turn lies therebelow serves as an adjustable thermal barrier and electrical insulation with regard to the silicon heat sink 59, which in this embodiment is formed by a p-Si substrate. The switching zone 61 is located along a lateral extension 45 of the phase change memory 41 between the first electrical contact 47 and the second electrical contact 51, wherein current conduction 63 of the current signal through the switching zone 61 takes place along the lateral extension 45. In particular, in this embodiment, the switching zone 61 is located at a narrowing 65 between the first electrical contact 47 and the second electrical contact 51 in the memory material layer 49. The size 67 of the narrowing 65 is smaller than a size 69 of the memory material layer 49 at the first electrical contact 47 or second electrical contact 51. The narrowing 65 is formed in the lateral extension in this example of embodiment.

FIG. 4 shows a second preferred embodiment 71 of the proposed phase change memory, in which, unlike in FIG. 3, the first electrical contact 73 and the second electrical contact 75 are located above the memory material layer 49. In this embodiment 71, the switching zone 61 is located in a region between and below the first electrical contact 73 and the second electrical contact 75 along the lateral extension 45. Views (a) and (b) of FIG. 4 show a modified (compared to FIG. 3) current conduction 77 of the current signal through the switching zone 61 along the lateral extension 45 of the phase change memory 71. Otherwise, the same references as in FIG. 3 are used for elements of this embodiment which have the same function.

Both in FIG. 3 and in FIG. 4, the first electrical contact 73, 47 and/or the second electrical contact 75, 51 directly adjoins the memory material layer 49 and the switching zone 61 is formed in the memory material layer 49 at a distance from the first electrical contact 73, 47 and/or second electrical contact 75, 51. The thermal distance 79 of the switching zone 61 from the electrical contacts 73, 47 and 75, 51 is preferably between 20 nm and 50 nm.

In FIG. 3 and FIG. 4, in each case a narrowing 65 has been formed along the lateral extension 45. Moreover, a narrowing of the memory material layer 49 could also be effected along the vertical extension 43, which is not shown in FIGS. 3 and 4 but will be explained with reference to FIG. 6.

In the lateral extension 45, the size of the structure is defined by the minimum feature size F, which with current technology in any case lies in a range from approximately 45 nm to 130 nm but with future technology will lie much below 45 nm. In the vertical extension, the switching zone in the present lateral concept of a phase change memory 41, 71 can be processed to a thickness D from below 5 nm to an atomic layer thickness of 0.5 nm. The traversing surface area, formed by the sizes F×D perpendicularly to the lateral extension 45, for the current conduction 63, 77 in the switching zone 61 is in the present lateral concept and structure of a phase change memory 41, 71 much smaller than the smallest possible traversing surface area defined by $F^2$ for the current conduction in a phase change memory of conventional vertical structure. Depending on requirements, in the first and second preferred embodiments of FIGS. 3 and 4 explained here, a ratio of the traversing surface area for the current conduction 63, 77 in the switching zone 61 to a traversing surface area for the current conduction at the first electrical contact 47, 73 or second electrical contact 51, 75 can be narrowed, wherein the ratio of the traversing surface areas preferably lies between 1:2 and 1:100.

FIG. 5 shows a first, schematically shown processing sequence in three steps (a), (b) and (c) for a further preferred embodiment of a proposed phase change memory 81. The top diagrams in each case show a plan view along the lateral extension 83. The bottom diagrams in each case show a sectional view along the vertical extension 85. The starting material for this basic processing sequence is a silicon substrate 87, onto which a layer system is deposited as a MESA structure 89 comprising the individual layers in the lithography/deposition plane along the lateral extension 83. In this embodiment, the substrate 87 at the same time serves as a heat sink. Firstly, an insulator as a heat conduction layer 91 and insulation is applied to the substrate 87. In this embodiment, said insulator is a $ZnS:SiO_2$ layer, wherein the ratio of ZnS to $SiO_2$ is 70:30. Thereafter, a phase change material is applied as a memory material layer 93. In this embodiment, the phase change material is an [Sn]:GeSbTe-based material. Finally, a passivation layer 95, here composed of $SiO_2$, is applied. In step (b), a MESA structure is defined and structured via a suitable lithography and etching process. In step (c), contact windows are made in the passivation layer 95 via a lithography and etching process, and are metallized with electrical contacts 97 via a lift-off process.

FIG. 6 shows a second schematically shown processing sequence in five steps (a), (b), (c), (d) and (e) according to another preferred embodiment of the proposed phase change memory 101. This is once again formed by a MESA structure 103. The top diagrams in each case show a plan view along the lateral extension 83. The bottom diagrams in each case show a sectional view along the vertical extension 85.

The present preferred embodiment of the phase change memory 101 has the advantage of a reduced bulk resistance and cell passivation. The reduced bulk resistance results in a lower operating voltage, and the cell passivation prevents the inward diffusion of surrounding oxygen from the air. The starting point in the further preferred embodiment of FIG. 6 is a modified layer system (shown in diagram (a)) composed of a substrate 105, a heat conduction layer 107, a memory material layer 109 and then an electrically conductive layer 111 as the uppermost layer.

Via a suitable lithography and etching process (b), firstly a MESA structure is defined and structured. A further lithography and etching process (c) defines and structures a trench 113 in the region of the switching zone. The trench 113 at one side divides the uppermost electrically conductive layer 111, and thus defines a position for the electrical contacts 115. At the other side, the thickness D of the switching zone 119 is set by adjusting the etching depth 117. The current consumption of the phase change memory 101 is thus also set. In this further embodiment of the phase change memory 101 of FIG. 6, the thickness D of the memory material layer 109, as the size of a narrowing in the vertical extension 85, is thus smaller than a size 121 of the memory material layer 109 in the vertical extension 85 at the contacting area, consisting of the electrical contacts 115 and the divided electrically conductive layer 111.

By means of a suitable deposition process (d), the existing layer sequence is provided with a passivation 123. In a further step (e), contact windows are structured in the deposited passivation 123 by means of a lithography and etching step, and in turn are metallized with electrical contacts 115 by means of a lift-off process.

Figure 7:
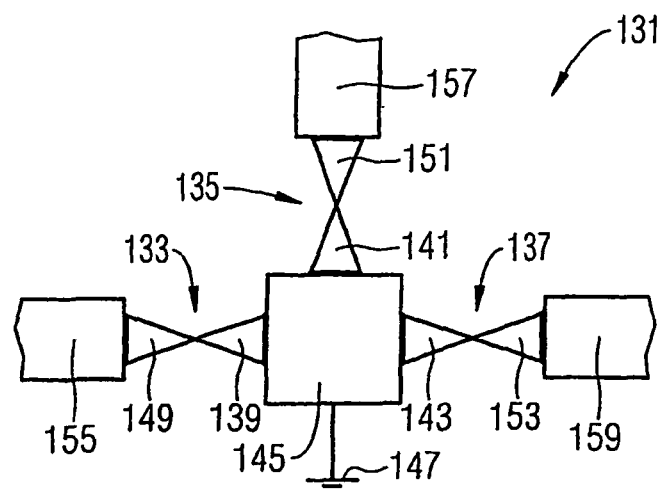
FIG. 7 is a preferred embodiment of a phase change memory assembly, in which in each case one of the electrical contacts of each phase change memory lies at the same electrical potential as a respective one of the electrical contacts of the other phase change memories.

FIG. 7 shows a preferred embodiment of a phase change memory assembly 131 which links together a first phase change memory 133, a second phase change memory 135 and a third phase change memory 137. In each case one of the electrical contacts 139, 141, 143 of each phase change memory 133, 135, 137 is placed at the same electrical potential as a respective one of the electrical contacts 139, 141, 143 of the other phase change memories by leading all the electrical contacts 139, 141 and 143 to a common pad 145 which is at ground 147. The respective other electrical contacts 149, 151, 153 are assigned a switchable fixed potential via a further associated pad 155, 157, 159 in each case.

This embodiment of a phase change memory assembly 131 is to be understood as merely one example of many embodiments of a phase change memory assembly which can be implemented depending on requirements.

Figure 8:
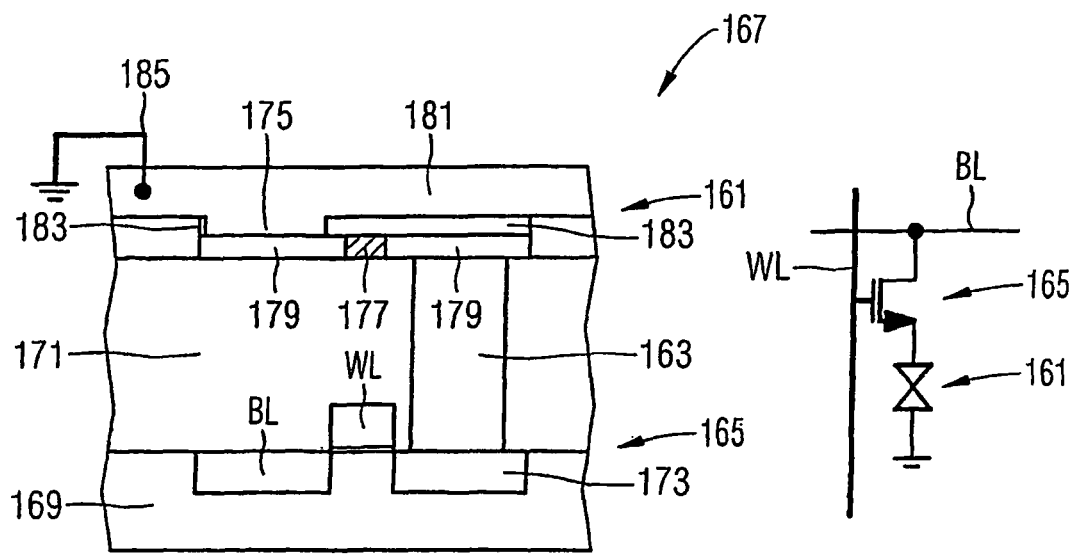
FIG. 8 is a schematically shown particularly preferred embodiment of a phase change memory cell on a CMOS control transistor with equivalent circuit diagram.

According to the embodiments shown schematically in FIGS. 8 and 9, the build-up of a phase change memory cell from a phase change memory or a phase change memory assembly takes place within the context of a CMOS integration of phase change memory cells in the lateral structure and concept.

One particularly preferred embodiment of the integration of a phase change memory 161 takes place, as shown in FIG. 8, via a first electrical contact 163 on a CMOS control transistor 165. The corresponding equivalent circuit diagram is shown on the right-hand side of FIG. 8. The phase change memory cell 167 of FIG. 8 is processed on a silicon substrate 169 and is moreover provided with a passivation 171. The control transistor 165 defines in this embodiment a bit line BL via source or drain, a word line WL via its gate, and a switching contact 173 to the metallic contacting 163 via source or drain.

The phase change memory 161 is provided with a passivation 171 and in a memory material layer 179 has a switching zone 177 which is located between and at a distance from the first electrical contact 163 and the second electrical contact 175. In the embodiment of the phase change memory 161 which is shown in FIG. 8, a heat sink 181 is located as metal layer above the memory material layer 179, wherein the memory material layer 179 and the heat sink 181 are insulated from the memory material layer 179 via an insulation layer 183 for thermal and electrical insulation. The heat sink 181, which is formed as a metallization over the entire surface, also forms the ground terminal 185 in the present embodiment of a phase change memory 161.

FIG. 9 shows a preferred embodiment of a phase change memory cell 187 which has been modified compared to FIG. 8. Elements of the phase change memory cell 187 of FIG. 9 and of the phase change memory cell 167 of FIG. 8 which have the same function have been provided with the same references. In the embodiment of the phase change memory cell 187, unlike in the embodiment of a phase change memory cell 167, it is not a transistor 165 which is connected upstream of the phase change memory 162 as a selection unit with a non-linear current/voltage characteristic for actuation purposes, but rather a diode 191. In this case, the upper, second electrical contact 175 can be used as the word line and the lower, first electrical contact 163 can be used as the bit line (or vice versa) directly for an X/Y addressing operation as explained with reference to FIGS. 10 and 11.

The diode 191 is furthermore integrated in the phase change memory 162. In the phase change memory cell 167 of FIG. 8, the transistor 165 as selection unit was connected externally upstream of the phase change memory 161. In the present case, in the phase change memory cell 187 of FIG. 9, the diode 191 is located between the memory material layer 179 and the first electrical contact 163 of the phase change memory 162.

In a modification of this embodiment, any selection unit could also be located between the memory material layer 179 and the second electrical contact 175.

The integration of a selection unit, in the present case a diode 191, has the advantage that this considerably simplifies the processing of a phase change memory cell 187 and moreover considerably increases the integration density for a phase change memory cell 187 on account of the reduced space requirement.

For future memory concepts, the cost factor "bit per area ratio" will play a dominant role. Thoughts of "stacking" the actual phase change memory cells above one another and thus forming three-dimensional 3D phase change memory cell arrays are of great interest in this connection. In the present case, the lateral structure and the lateral concept of a phase change memory as explained here offer a critical advantage for this type of integration compared to the vertical structure of a conventional phase change memory.

The build-up of a 3D phase change memory cell array takes place with a number of memory layers in the form of 2D phase change memory cell arrays which are arranged one above the other. A 2D phase change memory cell array 201 is shown in FIG. 10 in detail (a) and as an equivalent circuit diagram (b). The 2D phase change memory cell array 201 comprises a number of individually addressable phase change memory cells 203 which are connected two-dimensionally within the context of row/column (x/y) addressing. Each of the phase change memory cells 203 is in the present case composed of a transistor 205 and a phase change memory 207. A diode is preferably used instead of a transistor. A 3D phase change memory cell array 211 shown in FIG. 11 is shown in terms of its three-dimensional structure (a) and as an equivalent circuit diagram (b). It comprises a number of 2D phase change memory cell arrays 213 which are arranged one above the other. In this case, respective phase change memories 215 which are arranged directly above one another are actuated and contacted by a selection transistor 217 by way of a common via 219. In a phase change memory having a vertical structure, such an integration is possible only to a limited extent and has to date not been implemented since a common via cannot be implemented or can be implemented only with an additional space requirement. Rather, as described in U.S. Pat. No. 6,525,953 B1, a conventional 3D phase change memory cell array relies on the separate contacting of each individual row and column contact (correspondingly as a word line or bit line or vice versa) in all memory layers.

By contrast, in the present embodiment of a 3D phase change memory cell array 211 of FIG. 11, the switching of phase change memories 215 arranged directly above one another to a first fixed potential takes place by way of the common via 219. The row/column (x/y) addressing for the planes takes place in this way. All the phase change memories 215 lying one above the other along a Z-direction are thus at the fixed first potential defined by the via 219. The Z-addressing, for example the selection of the bottom phase change memory cell 215 in the embodiment 211 of FIG. 11, in this embodiment takes place by placing all the other phase change memory cells of the other 2D phase change memory cell arrays at a second, free potential, e.g. ground potential 221.

Figures 11A, 11B, 12:
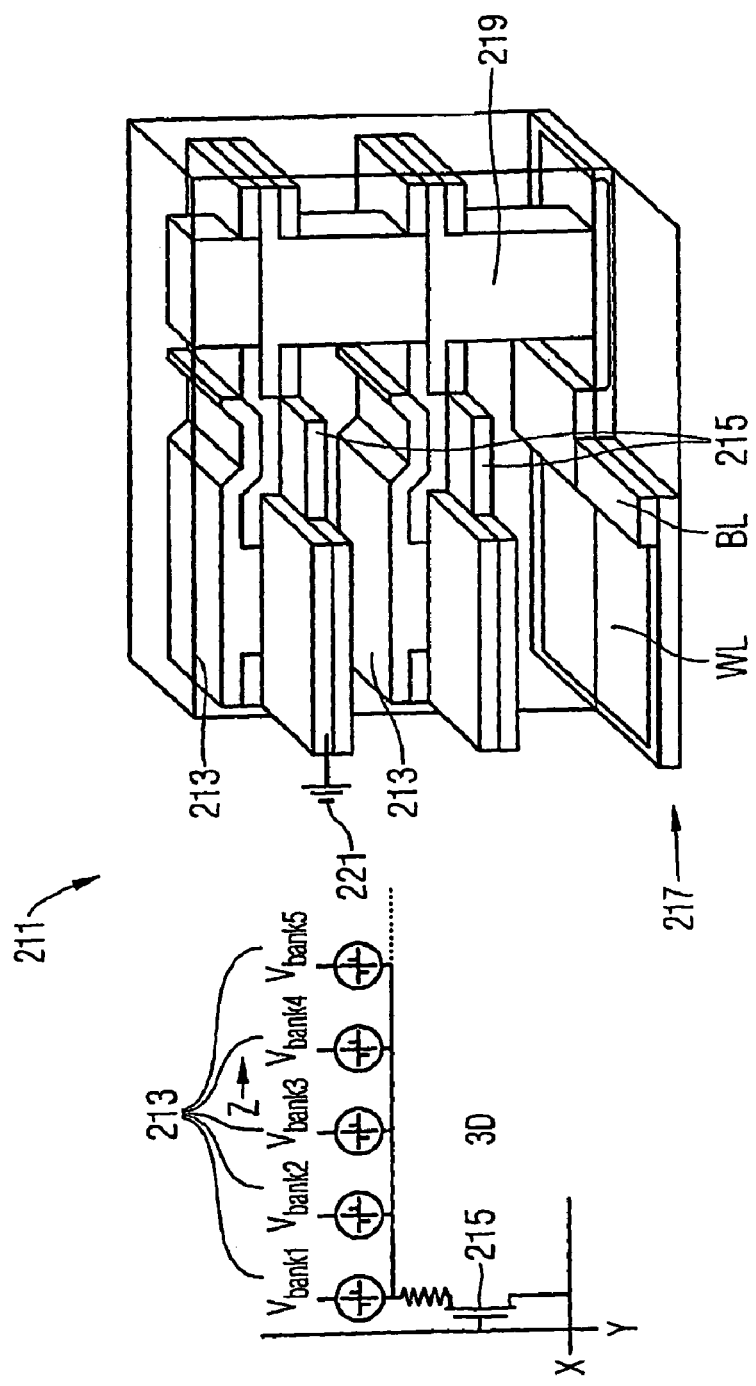
FIG. 12 is a schematically shown electronic module.

FIG. 12 shows an electronic component 225 (embedded device, e.g. ASICS) which combines an integrated memory function 227 and/or logic function 223. Here, the integrated memory function 227 and/or logic function 223 comprises a phase change memory, a phase change memory cell assembly, a phase change memory cell or a phase change memory cell array of the above-described type.

To summarize, the current flow limitation for switching a phase change memory (PC-RAM) represents a significant problem in phase change memories of the known type. All the previous concepts for implementing a phase change memory are based on vertical current conduction, which takes place perpendicularly to the lateral extension of the phase change memory between two electrical contacts lying above one another. Known phase change memories are thus designed for current conduction vertical to the lithography/deposition plane.

Particularly efficient current limitation is achieved in a phase change memory 21, 41, 71, 81, 101, 161, 162, 215 comprising a memory material layer 23, 49, 93, 109, 179 consisting of a phase change material, and a first 25, 47, 73, 97, 115 and second 27, 51, 75, 97, 115 electrical contact which are located at a distance from one another and via which a switching zone 31, 61, 119, 177 of the memory material layer 23, 49, 93, 109, 179 can be traversed by a current signal, wherein the current signal can be used to induce a phase change 11, 13 between a crystalline phase 3 and an amorphous phase 5 and thus a change in resistance 7 of the phase change material in the switching zone 31, 61, 119, 177. In such a phase change memory, it is provided within the context of the novel concept that the switching zone 31, 61, 119, 177 is located along a lateral extension 33, 45, 83 of the phase change memory between the first 25, 47, 73, 97, 115 and second 27, 51, 75, 97, 115 electrical contacts, wherein current conduction 35, 63, 77 of the current signal through the switching zone 31, 61, 119, 177 takes place along the lateral extension 33, 45, 83. Inter alia, a traversing surface area, formed perpendicularly to the lateral extension, for the current conduction 35, 63, 77 can be considerably reduced in this way, so that the switching current required for a current signal is considerably reduced.

The novel concept also relates to a phase change memory assembly 131, a phase change memory cell 167, 187, 203, a 2D phase change memory cell array 201, 213, a 3D phase change memory cell array 211 and an electronic component 225.

LIST OF REFERENCES 1 resistance/temperature graph
3 crystalline phase
5 amorphous phase
7 change in resistance
9 change in temperature
11 amorphization
13 crystallization
21 phase change memory
23 memory material layer
25 first electrical contact
27 second electrical contact
29 distance
31 switching zone
33 lateral extension
35 current conduction
41 first preferred embodiment of a phase change memory
43 vertical extension
45 lateral extension
47 first electrical contact
49 memory material layer
51 second electrical contact
53 passivation
55 core forming zone
57 ZnS:SiO$_2$ layer
59 silicon heat sink
61 switching zone
63 current conduction
65 narrowing
67 size
69 size
71 second preferred embodiment of a phase change memory
73 first electrical contact
75 second electrical contact
77 modified current conduction
79 thermal distance
81 further preferred embodiment of a phase change memory
phase change memory
83 lateral extension
85 vertical extension
87 silicon substrate
89 MESA structure
91 heat conduction layer
93 memory material layer
93 passivation layer
97 electrical contacts
101 phase change memory
103 MESA structure
105 substrate
107 heat conduction layer
119 memory material layer
111 electrically conductive layer
113 trench
115 electrical contacts 117 etching depth
119 switching zone
123 passivation
131 phase change memory assembly
133 first phase change memory
135 second phase change memory
137 third phase change memory
139, 141, 143 electrical contact
145 pad
147 ground
149, 151, 153 electrical contact
155, 157, 159 pad
161 phase change memory
162 phase change memory
163 first electrical contact
165 CMOS control transistor
167 phase change memory cell
169 silicon substrate
171 passivation
173 switching contact
175 second electrical contact
177 switching zone
179 memory material layer
181 heat sink
183 insulation layer
185 ground terminal
187 phase change memory cell
191 diode
201 2D phase change memory cell array
203 addressable phase change memory cells
205 transistor
207 phase change memory
211 3D phase change memory cell array
213 2D phase change memory cell array
215 phase change memory
217 selection transistor
219 via
221 ground potential
223 memory function and/or logic function
225 electronic component
227 application-specific component (embedded device)
D thickness

The invention claimed is:

1. A phase change memory comprising:
a phase change memory material layer having a lateral extension; and
first and second electrical contacts configured to define a lateral switching zone in the memory material layer between the first and second electrical contacts wherein the lateral switching zone can be traversed by a current signal that can be used to induce a reversible phase change in the phase change memory material layer between a crystalline phase and an amorphous phase and thus a change in resistance of the phase change material in the lateral switching zone.

2. The phase change memory according to claim 1 wherein current conduction of the current signal through the switching zone takes place along the lateral extension.

3. The phase change memory according to claim 2 wherein the lateral switching zone is located at a narrowing in the memory material layer between the first and second electrical contacts and the size of the narrowing is less than the memory material layer size at the first or second electrical contacts.

4. The phase change memory according to claim 3 further comprising a traversing surface area formed perpendicularly to the lateral extension for current conduction in the lateral switching zone and is narrowed in relation to a traversing surface area for current conduction at the first or second electrical contacts, wherein the ratio between the lateral switching zone traversing area and contact traversing areas is in a range of between 1:2 and 1:100.

5. The phase change memory according to claim 4 wherein a vertical extension size (D) of the lateral switching zone narrowing is less than the memory material layer vertical extension size at the first or second electrical contact.

6. The phase change memory according to claim 5 wherein the first and second electrical contacts adjoin the memory material layer and the switching zone is formed in the memory material layer at a distance from the first and/or second contact.

7. The phase change memory according to claim 6 wherein the distance between the first and second electrical contact is oriented along the lateral extension and the first electrical contact is located below the memory material layer and the second electrical contact is located above the memory material layer.

8. The phase change memory according to claim 6 wherein the distance between the first and second electrical contact is oriented along the lateral extension, wherein the first and the second electrical contacts are located above the memory material layer.

9. The phase change memory according to claim 7 wherein the lateral switching zone is located between the first and second electrical contacts and above the first and below the second electrical contact along the lateral extension.

10. The phase change memory according to claim 9 further comprising a core forming zone adjoining the memory material layer.

11. The phase change memory according to claim 10 wherein the first and second electrical contacts and the memory material layer form part of a mesa which is applied to a substrate, wherein the memory material layer is insulated from a heat sink by a thermal barrier.

12. The phase change memory according to claim 8 wherein the lateral switching zone is located between the first and second electrical contacts and below the first and second electrical contact along the lateral extension.

13. The phase change memory according to claim 12 further comprising a core forming zone adjoining the memory material layer.

14. The phase change memory according to claim 13 wherein the first and second electrical contacts and the memory material layer form part of a mesa which is applied to a substrate, wherein the memory material layer is insulated from a heat sink by a thermal barrier.

15. A phase change memory cell comprising:
a plurality of phase change memories, wherein each phase change memory comprises:
a phase change memory material layer having a lateral extension; and
first and second electrical contacts configured to define a lateral switching zone in the memory material layer between the first and second electrical contacts wherein the lateral switching zone can be traversed by a current signal that can be used to induce a reversible phase change in the phase change memory material layer between a crystalline phase and an amorphous phase and thus a change in resistance of the phase change material in the lateral switching zone; and
in each phase change memory cell, one of the electrical contacts of each phase change memory is at the same electrical potential as a respective one of the electrical contacts of the other phase change memories.

16. The phase change memory cell according to claim 15 further comprising a selection unit with a non-linear current/voltage characteristic.

17. The phase change memory cell according to claim 16 wherein the selection unit is integrated in the phase change memory and/or the phase change memory cell.

18. The phase change memory cell according to claim 16 wherein the selection unit is located in the phase change memory between the memory material layer and the first electrical contact and/or between the memory material layer and the second electrical contact.

19. A 2-dimensional phase change memory cell array comprising a plurality of two-dimensionally connected and individually addressable phase change memory cells wherein each memory cell comprises:
   a plurality of phase change memories, wherein each phase change memory comprises:
      a phase change memory material layer having a lateral extension; and
      first and second electrical contacts configured to define a lateral switching zone in the memory material layer between the first and second electrical contacts wherein the lateral switching zone can be traversed by a current signal that can be used to induce a reversible phase change in the phase change memory material layer between a crystalline phase and an amorphous phase and thus a change in resistance of the phase change material in the lateral switching zone; and
   in each phase change memory, one of the electrical contacts of each phase change memory is at the same electrical potential as a respective one of the electrical contacts of the other phase change memories.

20. A 3D phase change memory cell array comprising:
   a plurality of two-dimensionally connected and individually addressable phase change memory cell arrays wherein each memory cell array comprises:
      a plurality of phase change memories, wherein each phase change memory comprises:
         a phase change memory material layer having a lateral extension; and
         first and second electrical contacts configured to define a lateral switching zone in the memory material layer between the first and second electrical contacts wherein the lateral switching zone can be traversed by a current signal that can be used to induce a reversible phase change in the phase change memory material layer between a crystalline phase and an amorphous phase and thus a change in resistance of the phase change material in the lateral switching zone; and
      in each phase change memory, one of the electrical contacts of each phase change memory is at the same electrical potential as a respective one of the electrical contacts of the other phase change memories; and
   arranged one above the other, wherein respective phase change memories which are arranged directly above one another are contacted by way of a common via.

21. The 3D phase change memory cell array according to claim 20 further comprising:
   in order to address a selected phase change memory of a 2D phase change memory cell array, respective phase change memories which are arranged directly above one another can be switched to a first potential by way of the common via, and in the process all the other phase change memory cells of any other 2D phase change memory cell array can be switched to a second potential.

22. An electronic component with an application specific module and an integrated memory function and/or logic function, comprising:
   a phase change memory comprising:
      a phase change memory material layer having a lateral extension; and
      first and second electrical contacts configured to define a lateral switching zone in the memory material layer between the first and second electrical contacts wherein the lateral switching zone can be traversed by a current signal that can be used to induce a reversible phase change in the phase change memory material layer between a crystalline phase and an amorphous phase and thus a change in resistance of the phase change material in the lateral switching zone.

23. The electronic component according to claim 22 further comprising a phase change memory cell wherein the phase change memory cell comprises:
   a plurality of phase change memories; and
   in each phase change memory cell, one of the electrical contacts of each phase change memory is at the same electrical potential as a respective one of the electrical contacts of the other phase change memories.

24. The electronic component according to claim 23 further comprising a plurality of two-dimensionally connected and individually addressable phase change memory cell arrays wherein each memory cell array comprises a plurality of phase change memory cells arranged one above the other, wherein respective phase change memories which are arranged directly above one another are contacted by way of a common via.

* * * * *